(12) United States Patent
Dua et al.

(10) Patent No.: US 7,356,674 B2
(45) Date of Patent: *Apr. 8, 2008

(54) METHOD AND APPARATUS FOR FETCHING INSTRUCTIONS FROM THE MEMORY SUBSYSTEM OF A MIXED ARCHITECTURE PROCESSOR INTO A HARDWARE EMULATION ENGINE

(75) Inventors: Anuj Dua, San Jose, CA (US); James E McCormick, Jr., Fort Collins, CO (US); Stephen R. Undy, Ft Collins, CO (US); Barry J Arnold, Ft Collins, CO (US); Russell C Brockmann, Ft Collins, CO (US); David Carl Kubicek, Fort Collins, CO (US); James Curtis Stout, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 465 days.

This patent is subject to a terminal disclaimer.

(21) Appl. No.: 10/717,671

(22) Filed: Nov. 21, 2003

(65) Prior Publication Data
US 2004/0107335 A1    Jun. 3, 2004

Related U.S. Application Data

(63) Continuation of application No. 09/510,010, filed on Feb. 22, 2000, now Pat. No. 6,678,817.

(51) Int. Cl.
*G06F 15/00*    (2006.01)

(52) U.S. Cl. ...................................... 712/205; 712/227

(58) Field of Classification Search .................. 712/43, 712/205, 229, 227; 703/26, 27
See application file for complete search history.

(56) References Cited

U.S. PATENT DOCUMENTS 5,448,705 A    9/1995 Nguyen et al.
5,515,521 A * 5/1996 Whitted et al. ................. 711/3
5,537,559 A * 7/1996 Kane et al. .................. 712/244
5,584,037 A * 12/1996 Papworth et al. ............. 712/23
5,732,235 A * 3/1998 Kahle et al. ................. 712/209

FOREIGN PATENT DOCUMENTS

WO     WO 87/01482      3/1987

OTHER PUBLICATIONS

Preliminary Search Report issued Mar. 28, 2007 in counterpart foreign application in France under application No. 0012788.

* cited by examiner

*Primary Examiner*—David J. Huisman

(57) ABSTRACT

A method of, and apparatus for, interfacing the hardware of a processor capable of processing instructions from more than one type of instruction set. More particularly, an engine responsible for fetching native instructions from a memory subsystem (such as an EM fetch engine) is interfaced with an engine that processes emulated instructions (such as an x86 engine). This is achieved using a handshake protocol, whereby the x86 engine sends an explicit fetch request signal to the EM fetch engine along with a fetch address. The EM fetch engine then accesses the memory subsystem and retrieves a line of instructions for subsequent decode and execution. The EM fetch engine sends this line of instructions to the x86 engine along with an explicit fetch complete signal. The EM fetch engine also includes a fetch address queue capable of holding the fetch addresses before they are processed by the EM fetch engine. The fetch requests are processed such that more than one fetch request may be pending at the same time. If a pending fetch request is canceled due to a pipeline flush, then the fetch address queue is cleared and the pending fetch requests are canceled. The system also prevents macroinstruction (MIQ)-related stalls by using a speculative write pointer to control the issuance of fetch requests, thereby preventing the MIQ from becoming oversubscribed.

15 Claims, 6 Drawing Sheets

Progression of Fetch Address Through Fetch Engine (40)

|   | IIP (320) | IPG (330) | ROT (340) |
|---|---|---|---|
| t | A | | |
| t+1 | B | A | |
| 511 - t+2 | C | B | A |
| 512 - t+3 | D | C | B |
| 513 - t+4 | D | C | B |
| t+5 | E | D | C |
| t+6 | F | E | D |

*Fig. 4a* x86 Engine Mirrored Progression of Fetch Addresses (30)

|   | BT1 (350) | BT2 (360) | BT3 (370) | ALN (380) |
|---|---|---|---|---|
| t | A | | | |
| t+1 | B | A | | |
| 521 - t+2 | C | B | A | |
| 522 - t+3 | D | C | B | A |
| 523 - t+4 | D | C | B | -- |
| 524 - t+5 | E | D | C | B |
| t+6 | F | E | D | C |

*Fig. 4b*

Progression of Fetch Address 120 Through Fetch Engine (40)

|       | IIP (320) | IPG (330) | ROT (340) |
|-------|-----------|-----------|-----------|
| t     | A         |           |           |
| t+1   | B         | A         |           |
| t+2   | C         | B         | A         |
| t+3   | D         | C         | B         |
| t+4   | D         | C         | B         |
| t+5   | E         | D         | C         |
| t+6   | F         | E         | D         |

531 - t+2
532 - t+3
533 - t+4

(Prior Art)

*Fig. 5a* x86 Engine Mirrored Progression of Fetch Requests 120

|       | BT1 (350) | BT2 (360) | BT3 (370) | ALN (380) |
|-------|-----------|-----------|-----------|-----------|
| t     | A         |           |           |           |
| t+1   | B         | A         |           |           |
| t+2   | C         | B         | A         |           |
| t+3   | D         | C         | B         | A         |
| t+4   | E         | D         | C         | B         |
| t+5   | E         | D         | C         | B         |
| t+6   | F         | E         | D         | C         |

541 - t+2
542 - t+3
543 - t+4
544 - t+5

(Prior Art)

*Fig. 5b*

METHOD AND APPARATUS FOR FETCHING INSTRUCTIONS FROM THE MEMORY SUBSYSTEM OF A MIXED ARCHITECTURE PROCESSOR INTO A HARDWARE EMULATION ENGINE

CROSS REFERENCE TO RELATED APPLICATION(S)

This application is a continuation of application Ser. No. 09/510,010, filed Feb. 22, 2000, now U.S. Pat. 6,678,817 entitled "METHOD AND APPARATUS FOR FETCHING INSTRUCTIONS FROM THE MEMORY SUBSYSTEM OF A MIXED ARCHITECTURE PROCESSOR INTO A HARDWARE EMULATION ENGINE," which is incorporated herein by reference.

TECHNICAL FIELD

The technical field relates to digital computer systems and fetching instructions. More particularly, it relates to methods and an apparatus for fetching instructions from a computer memory in a mixed architecture.

BACKGROUND

In the field of computer architecture, a single chip may process instructions from multiple instruction sets. In such mixed architectures, the processor hardware is designed and optimized for executing instructions from one instruction set generally referred to as the native instruction set, while emulating other instruction sets by translating the emulated instructions into operations understood by the native hardware. For example, the IA-64 architecture supports two instruction sets—the IA-32 (or x86) variable length instruction set and the fixed-length enhanced mode (EM) instruction set. When executing the IA-32 instruction set, the central processing unit (CPU) is said to be in IA-32 mode. When executing EM instructions, the CPU is said to be in EM mode. Native EM instructions are executed by the main execution hardware of the CPU in EM mode. However, the variable length IA-32 instructions are processed by the IA-32 (or x86) engine and broken down into native EM mode instructions for execution in the core pipeline of the machine. In x86 mode, it is desirable to retrieve instructions from the IA-64 memory subsystem into an x86 engine. To accomplish this, the x86 execution engine must interface with the EM pipeline, because the memory subsystem is tightly coupled to the EM pipeline. The x86 hardware support exists primarily to support legacy software. For this reason, it is desirable that the x86 engine not slow the processing of native instructions in the EM pipeline.

Existing methods of fetching instructions, such as those methods previously implemented in IA-64 architecture, use dual pipelines—the EM pipeline and the x86 pipeline—to process instructions. In these methods, the x86 engine simply sends a fetch address to the EM fetch engine, which accesses the memory subsystem and returns a line of instructions for depositing to a macroinstruction queue (MIQ) in the x86 engine. While both pipelines are synchronized to process the same set of addresses, they operate independently such that the x86 engine sends a new fetch address in each clock cycle, and the EM fetch engine retrieves a new line of instructions in each clock cycle.

In the presence of pipeline stalls (for example due to a cache miss), the pipelines could go out of synchronization. This is because, given the physical separation of the x86 engine and the EM fetch engine it takes one complete clock-cycle to transmit information between these pipelines. In the case of a stall, it is not possible to report the stall to the x86 engine in the same cycle that the fetch engine sees it. That is, the x86 engine would not notice the stall in the EM pipeline until at least one clock cycle after it occurred. Meanwhile, the x86 pipeline continues to advance the fetch address as though no stall had occurred. The x86 pipeline and the EM pipeline become unsynchronized and will process different instructions in corresponding pipeline stages. This requires a complicated stall recovery means to get the pipelines back into synchronization.

Another stall-related problem with existing methods of processing instructions is that there may not be enough room to write a line of returning instructions on the MIQ. That is, existing methods and apparatuses may try to write a new line of instructions to the MIQ, even though the MIQ may be full with unprocessed entries. One prior art method introduces a new stall to recover from this oversubscription to the MIQ. The detection and signaling of this new stall is cumbersome and combined with the earlier fetch-related stalls, requires complicated hardware to handle.

What is needed is a means of interfacing the hardware of a CPU that processes both native instructions and emulated instructions. In particular, what is needed is a method for retrieving instructions of one instruction set architecture (ISA) from the memory of a different, native ISA, while avoiding the problems associated with pipeline stalls and the complexities inherent to the dual, synchronous pipeline system.

SUMMARY

Disclosed is a method for implementing a native instruction set architecture (ISA), having an emulation engine, and an emulated ISA, where the emulated ISA includes a fetch engine responsible for fetching native instructions from a memory subsystem. The fetch engine is interfaced with the emulation engine. This is achieved using a handshake protocol, whereby the emulation engine sends an explicit fetch request signal to the fetch engine along with a fetch address. The fetch engine then accesses the memory subsystem and retrieves a line of instructions for subsequent decode and execution. The fetch engine sends this line of instructions to the emulation engine along with an explicit fetch complete signal. The fetch engine also includes a fetch address queue capable of holding the fetch addresses before they are processed by the fetch engine. The fetch requests are processed such that more than one fetch request may be pending at the same time. If a pending fetch request is canceled due to a pipeline flush, then the fetch address queue is cleared and the pending fetch requests are canceled. The system also prevents macroinstruction (MIQ)-related stalls by using a speculative write pointer to control the issuance of fetch requests, thereby preventing the MIQ from becoming oversubscribed.

Also disclosed is a computer system capable of processing instructions from more than one instruction set and an engine that fetches native instructions from a memory subsystem (such as an EM fetch engine), and an engine that processes emulated instructions (such as an x86 engine) is described. The EM fetch engine has a fetch address queue. The EM fetch engine interfaces with the memory subsystem and the x86 engine by using a handshake protocol. The x86 engine sends an explicit fetch request signal to the EM fetch engine along with a fetch address. The EM fetch engine then accesses the memory subsystem and retrieves a line of instructions. The EM fetch engine sends this line of instructions to the x86 engine along with an explicit fetch complete signal. The EM fetch engine also includes a fetch address queue capable of holding the fetch addresses before they are processed by the EM fetch engine. The fetch requests are processed such that more than one fetch request may be pending at the same time. If a pending fetch request is canceled due to a pipeline flush, then the fetch address queue is cleared and the pending fetch requests are canceled. The system also prevents macroinstruction (MIQ)-related stalls by using a speculative write pointer to control the issuance of fetch instructions, thereby preventing the MIQ from becoming oversubscribed.

DESCRIPTION OF THE DRAWINGS

The detailed description will refer to the following drawing in which like numbers refer to like items and in which:

FIG. 4A is a chart showing the progression of fetch requests through the EM pipeline;

FIG. 4B is a chart showing the progression of fetch requests through the x86 pipeline;

FIG. 5A is a chart showing the progression of fetch requests through the EM pipeline of existing methods;

FIG. 5B is a chart showing the progression of fetch requests as tracked by the x86 pipeline of existing methods.

DETAILED DESCRIPTION

The system improves interfacing between hardware in a processor that implements both a native instruction set and an emulated instruction set by replacing the synchronous, stall-controlled mechanism with a handshake based fetch protocol. It will be recognized by one skilled in the art that the system may be used by any engine that attempts to emulate one instruction set architecture (ISA) using another ISA. By way of illustration only, and not by way of limitation, the embodiment of the system is shown to interface an x86 engine and an IA-64 memory subsystem. The memory subsystem includes any apparatus that may be used to store instruction bytes, including a cache system, a main memory, and any other memory used by the system.

Figure 1:
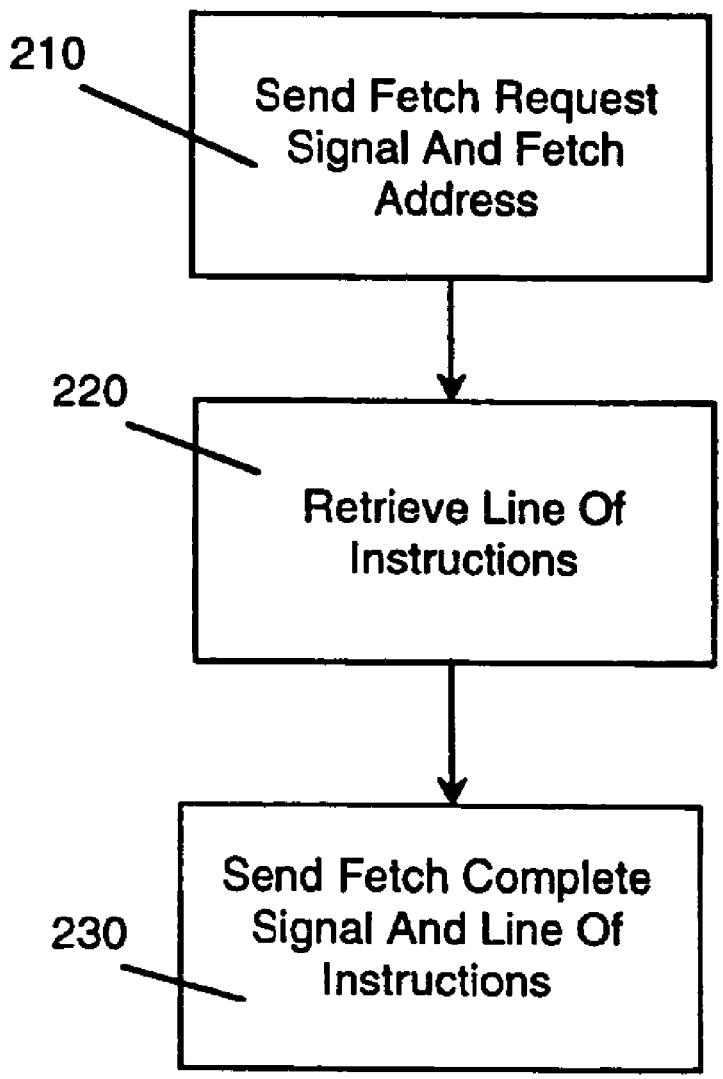
FIG. 1 is a flow chart showing a method of fetching instructions.

FIG. 1 shows a flow chart of the method of the system. When the x86 engine needs new instructions to process, it sends 210 a "fetch request signal" to the fetch engine. The x86 engine also sends 210 a "fetch address," to the fetch engine. The fetch address is the information used by the fetch engine to retrieve a line of instructions from the memory subsystem. In one embodiment, the fetch request signal is sent simultaneously with the fetch address. The fetch engine accesses the memory subsystem and retrieves a line of instructions. Unless a pending fetch request is canceled due to a pipeline flush, the fetch engine then sends 230 a "fetch complete" indication back to the x86 engine. The fetch complete indication completes the handshake between the fetch engine and the x86 engine, by indicating that the fetch request was successfully fulfilled. Along with the fetch complete indication, the fetch engine also sends 230 a line of instructions to the x86 engine.

Figure 2:
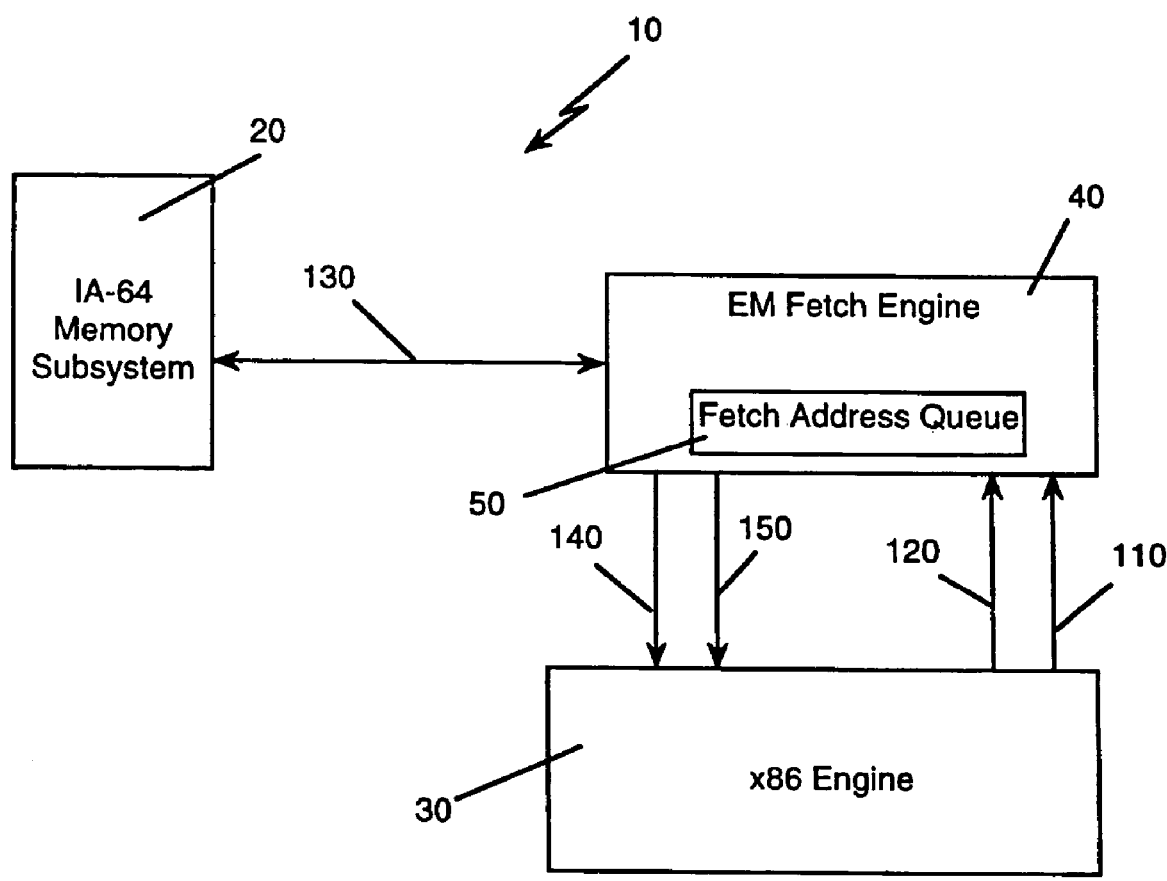
FIG. 2 is a block diagram showing the operation of the system.

FIG. 2 shows a computer system 10, having a memory subsystem 20, an x86 engine 30, and a front-end of the EM core pipeline, referred to as the EM fetch engine 40. Within the fetch engine 40 is a fetch address queue 50. The fetch engine 40 interfaces with the memory subsystem 20 to fetch instructions (either EM or IA-32 instructions) for execution. In IA-32 mode, the fetch engine 40 delivers IA-32 instructions to the x86 engine 30 for further processing.

The handshake method explained above and in FIG. 1 is shown to be implemented on the system 10. The fetch request signal 110 is sent (210 in FIG. 1) from the x86 engine 30 to the fetch engine 40. At the same time, a fetch address 120 is also sent (210 in FIG. 1) from the x86 engine 30 to the fetch engine 40. The fetch engine 40 then accesses the memory subsystem 20 and retrieves (220 in FIG. 1) a line of instructions 130. Unless a pending fetch request is canceled due to a pipeline flush, the fetch engine 40 then sends (230 in FIG. 1) a fetch complete signal 140 to the x86 engine 30, indicating that the fetch request was successful. Along with the fetch complete indication 140, the fetch engine 40 sends (230 in FIG. 1) the line of instructions 150 to the x86 engine 30. As used herein, the reference number 130 refers to the line of instructions retrieved from memory 20 and the reference number 150 refers to the line of instructions passed from the fetch engine 40 to the x86 engine 30.

In one embodiment, 16 sequential bytes of instructions are requested from the fetch engine 40 by sending a fetch request signal 110. In this embodiment, the x86 engine 30 sends a 16-byte aligned 28-bit fetch address 120 to the fetch engine 40 at the same time as it sends the fetch request signal 110. In this embodiment, the fetch engine 40 accesses (220 in FIG. 1) the memory subsystem 20 and returns (230 in FIG. 1) the 16 bytes of instruction data 150 back to the x86 engine 30 along with a "fetch complete" indication 140.

Figure 3:
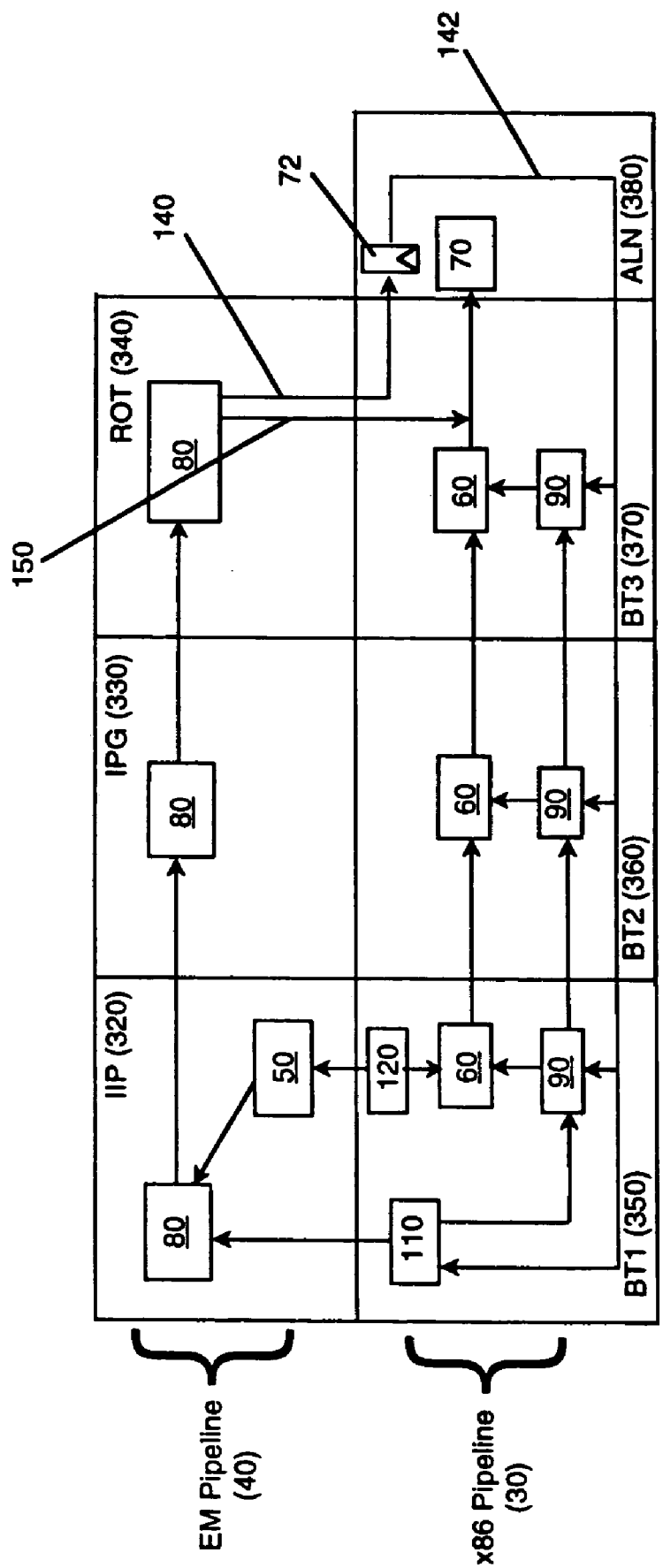
FIG. 3 is a more detailed block diagram showing the pipeline.

FIG. 3 shows a more detailed diagram of one embodiment of the computer system 10. The native fetch engine (in this example, an EM fetch engine) 40 and the emulation engine (in this example, an x86 engine) 30 can be thought of as two parallel pipelines—i.e., the EM pipeline 40 and the x86 pipeline 30. The fetch engine 40 fetches lines of instructions 130 from the memory subsystem 20 of the IA-64 processor to be executed in the x86 engine 30. To accomplish this, the x86 engine 30 requests a line of instructions from the fetch engine (the EM pipeline) 40. In the embodiment shown, the EM pipeline 40 has three stages used for this invention—the BP 320, the IPG 330, and the ROT 340. The EM pipeline 40 also uses a fetch address queue 50, which is in the IIP stage 320. The fetch address queue 50 is used to store fetch addresses 120 sent from the x86 engine 30 when the EM pipeline 40 is stalled. The fetch address queue can thus buffer fetch requests while the memory subsystem is accessed for a particular line of instructions. In the embodiment shown, the fetch address queue 50 holds as many as three separate fetch addresses 120 as they are processed by the EM pipeline 40. The x86 pipeline 30 has three corresponding stages—BT1 350, BT2 360, BT3 370. The x86 pipeline 30 also has its own x86 address queue 60, which spans the respective stages of the x86 pipeline 30. The x86 address queue 60 mirrors the entries in fetch address queue 50 of the EM pipeline 40.

A group of logic functions, referred to as the pipeline-advance logic 90, is applied to the addresses 120 in the respective stages of the x86 address queue 60 to advance the fetch addresses 120 along the x86 pipeline 30. The pipeline-advance logic 90 is designed to move the oldest outstanding fetch address 120 toward the BT3 stage 370. Once each of the x86 pipeline stages BT1 350, BT2 360, BT3 370 have valid addresses 120 corresponding to the three pending fetch-requests in the EM pipeline 30, the addresses 120 are advanced only after a line of instructions 150 has been returned for the oldest outstanding request 120. To accomplish this, the pipeline-advance logic 90 uses a delayed version of the fetch complete indication 142 to advance the addresses 120 along the x86 pipeline 30. As shown, the fetch complete indication 140 is sent to from the BT3 stage 370 to a latch 72 in the align (ALN) stage 380 of the x86 pipeline 30.

The output of the latch 72 is the delayed fetch complete signal 142, which is then used by the pipeline-advance logic 90 and which controls fetch request signals 110. At each stage 320, 330, 340 of the EM pipeline 40, EM logic functions 80 work to fetch a line of instructions 150 from the memory subsystem 20. When a line of instructions 150 is returned to the x86 engine 30, it is for the address 120 in the BT3 stage 370, which represents the oldest unsatisfied fetch request. The instruction information is buffered and placed into an MIQ 70 one clock cycle later in the ALN stage 380 of the x86 engine 30.

It should be appreciated that multiple fetch requests may be pending or "in-flight" at the same time. FIGS. 4A and 4B show the progression of fetch addresses 120 through the respective stages of the EM pipeline 40 and the x86 pipeline 30 at progressive clock cycles. The left side of FIGS. 4A and 4B shows progressive clock cycles, as t, t+1, t+2, t+3, t+4, . . . t+n. The tops of FIGS. 4A and 4B show three stages 320, 330, 340 of the EM pipeline 40 and three stages 350, 360, 370 of the x86 pipeline 30, respectively. FIG. 4A shows, for progressive clock cycles, the location of fetch addresses 120 within the respective stages 320, 330, 340 of the EM pipeline 40. FIG. 4B shows the corresponding location of fetch addresses 120 within the respective three stages 350, 360, 370 of the x86 address queue 60. In addition, an ALN pipeline stage 380 follows the BT3 pipeline stage 370 of the x86 engine 30. The MIQ 70 is written in this stage 380. Examples of successively issued fetch addresses 120 are represented by the letters "A, B, C, D, etc." Certain times (e.g., 511-513 in FIG. 4A, 521-524 in FIG. 4B, 531-533 in FIG. 5A, and 541-544 in FIG. 5B) are labeled and correspond to the keys set forth below, summarizing operations at certain times.

For example, at the first clock cycle t, a fetch request signal $110_A$ is sent for the first fetch address A. Fetch address A is in the IIP stage 320 of the EM pipeline 40, where the EM pipeline 40 receives the fetch address 120 along with the fetch request signal 110. At the second clock cycle t+1, a fetch request signal $110_B$ is sent for the second fetch address B, while the memory subsystem 20 is prepared for fetching the first address A. A is in the IPG stage 330, and B is in the IIP stage 320. At the third clock cycle t+2 511, a fetch request signal $110_C$ is sent for the third fetch address C, and the memory subsystem 20 is prepared for the second fetch address B. For the first fetch address A, the memory subsystem 20 is accessed, the line of instructions 130 is received by the fetch engine 40, and the line of instructions 150 is delivered to the x86 engine 30. In the EM pipeline 40, A is in the ROT stage 340, B is in the IPG stage 330, and C is in the IIP stage 320. In the next clock cycle t+3 512, the line of instruction bytes 150 for address A is written into the MIQ 70 in the ALN stage 380 of the x86 pipeline 30 as shown in FIG. 4B. In the absence of pipeline stalls, this progression would continue with a new request being made and a new line of instructions being written to the MIQ 70.

In the example shown in FIGS. 4A and 4B, the fetch engine 40 is unable to satisfy the fetch request for address B in cycle t+3 512, 522, due to a cache miss. Because of this, no fetch complete indication 140 is signaled to the x86 engine 30 and the EM pipeline 40 stalls in time t+3 512. That is, address D is stalled in the IIP stage 320, address C is stalled in the IPG stage 330 and address B is stalled in the ROT stage 340. This situation continues until the machine has had a chance to interrogate as many levels of the memory hierarchy 20 as are needed to retrieve the line of instructions 130 for address B. Significantly, the entries in the x86 address queue 60 mirror the location of addresses 120 in the EM pipeline 40 for as long as the stall persists. That is address D remains stalled in the BT1 stage 340, address C remains stalled in the BT2 stage 350, and address B remains stalled in the BT3 stage 360. This is because the pipeline-advance logic 90 determines that there are currently three unsatisfied fetch requests in the EM pipeline 40 (for addresses D, C & B) and disables the advancing of addresses 120 along the x86 pipeline 30. In addition, new fetch requests are suppressed. When the line of instructions 150 is eventually returned for address B (shown in clock cycle t+4 513, 523 for simplicity in FIGS. 4A & 4B), the EM fetch engine 40 sends the line of instructions to the x86 engine 30 along with the fetch complete indication 140. A line of instructions for address B is then written to the MIQ 70 in cycle t+5 524. At the same time, the x86 pipeline-advance logic 90 samples the clock-delayed version of the fetch-complete indication 142 (that was sent for address B in cycle t+4) and advances the addresses along the x86 pipeline 30. A new fetch request is issued for address E and the progression continues. For the example shown in FIGS. 4A and 4B, the stall is shown to last for only one clock cycle. In practice it may be longer depending upon how long it takes to satisfy the fetch request.

The following key summarizes the progression of the EM pipeline of FIG. 4A at certain times:

511
    Fetch complete 140 and line of instructions 150 are returned for address A.
512
    Fetch complete 140 is not returned for address B.
    EM pipeline 40 stalls
513
    Fetch complete 140 and line of instructions 150 returned for address B
    EM pipeline stall released A corresponding key summarizes these points of the x86 pipeline 30 of FIG. 4B at certain times:

521
    Fetch complete 140 and lines of instructions 150 are returned for address A.
522
    Lines of instructions 150 for address A is written to the MIQ 70
    Fetch complete 140 is not returned for address B.
    x86 pipeline 30 stalled
523
    Fetch complete 140 and line of instructions 150 are returned for address B.
524
    Line of instructions for address B is written to the MIQ 70
    x86 pipeline 30 advances The progression of instructions through the method, as shown in FIGS. 4A and 4B, contrasts with the problems faced by existing methods. FIGS. 5A and 5B illustrate the problem of pipeline stalls in existing methods of operation by tracking the entries in the stages of the fetch engine 40 and those in the x86 engine 30. Existing methods do not use a buffer, such as the fetch address queue 50, so FIGS. 5A and 5B simply refer to the stages in which the fetch engine 40 is processing the requests and the stages in which the x86 engine 30 assumes the requests are being processed. That is, the x86 engine 30 tries to track the progression of instructions through the stages of the fetch engine 40, but is not always successful.

FIG. 5A shows the progression of the fetch addresses 120 though the various stages 320, 330, 340 of the fetch engine 40. FIG. 5B shows the progression of these same fetch addresses 120 though the respective stages 340, 350, 360 of the x86 engine 30. In addition, an align (ALN) pipeline stage 380 follows the BT3 pipeline stage 370 of the x86 engine 30. The MIQ 70 is written in this stage 380. The processing of the instructions is performed in the EM pipeline 40, but the x86 engine 30 attempts to track the progression of fetch addresses 120 through the stages of the fetch engine 40. So long as no stall occurs, the x86 engine 30 successfully tracks the progression of instructions, as shown in times t, t+1, and t+2 of FIGS. 5A and 5B.

However, FIGS. 5A and 5B again show the effect of a stall at time t+3 532, 542. In the following cycle t+4 533, fetch request B remains in the ROT stage 340, C remains in the IPG stage 330, and D remains in the IIP stage 320 of the fetch engine 40, as shown in FIG. 5A. However, the x86 engine 30 does not recognize the stall during the cycle in which it occurs, so it advances the fetch addresses 120 along the x86 pipeline, as shown at time t+4 543 in FIG. 5B. In time t+4 543 the x86 engine 30 recognizes the stall and thus repeats its prior entry in time t+5 544.

In FIG. 5A, the stall is shown to be released at time t+4 533 in the EM pipeline and the fetch engine 40 advances the fetch address 120 one stage. Again, however, the x86 engine 30 does not immediately recognize that the stall was released. It sees the stall release only at time t+5 544, which is when it eventually catches back up to the true progression of instructions in the fetch engine 40, as shown in FIG. 5B. This is unlike the system described herein which uses a fetch address queue 50 in the fetch engine 40 and an x86 address queue 60 in the x86 engine 30, and ensures that the x86 engine 30 accurately tracks the progression of fetch addresses 120 through the fetch engine 40.

The following key summarizes some events and illustrates the problems of the EM pipeline in existing methods at certain times:
Line of instructions 150 is returned for address A
532
EM pipeline 40 stalls (for example, due to a cache miss) for address B
533
EM pipeline stall is released
Line of instructions 150 for address B is returned
A corresponding key summarizes the operation of the x86 pipeline at certain times:
542
Line of instructions 150 for address A is written to MIQ 70
EM pipeline stall is not seen by x86 pipeline 30
543
EM pipeline stall is seen by x86 pipeline 30
x86 pipeline 30 goes out of sync with EM pipeline 40
Recovery buffer for address B is needed
544

EM pipeline stall release seen by x86 pipeline 30
x86 pipeline 30 does not advance
Line of instructions 150 for address B written to MIQ 70

The handshake protocol, described above, is designed to alleviate the complex recovery mechanisms that are needed by previous methods to keep two independent pipelines that interface with each other in sync. The handshake is, by definition, independent of the latency between a fetch request and its completion. This makes the implementation fairly straightforward and relatively easy to verify.

The x86 engine 30 will issue up to 3 fetch requests 110 before expecting the line of instructions for the request corresponding to the first fetch request $110_1$ to be returned. In the absence of front-end fetch related stalls (e.g., due to cache miss or to a TLB miss), data for the request of the first address $120_1$ is returned in the same cycle as the fetch request for the third fetch address $120_3$ is being made. Thus, new requests can continue to be pipelined, and a new fetch request made in every clock cycle. In the event of a front-end fetch stall, the fetch complete indication 140 will not be asserted until the stall condition is resolved and the data becomes available. The fetch engine 40 is able to buffer up to three fetch addresses in the fetch address queue 50 and process the corresponding data in a first-in, first-out (FIFO) fashion. Thus, a fetch request for the fourth fetch address $120_4$ will not be made by the x86 engine 30 until a fetch complete indication 140 is known to have been received from the oldest outstanding request in the previous cycle. By buffering up to three pending requests, the fetch request logic can use a clock-cycle-delayed version of the fetch complete indication 142 from the fetch engine to initiate the new request. This alleviates timing pressure on the fetch complete signal 140 coming from the fetch engine 40 while still maintaining the two pipelines 30, 40 in synchronization. In the event of pipeline flushes, the fetch queues 50 are emptied, and all in-flight, or pending, fetch requests 110 are canceled. Because the pipelines 30, 40 are in sync, there is no need to selectively flush the different stages of the pipeline as was necessary in earlier implementations. In addition, because the x86 engine 30 is designed to ensure that there are never more than three pending or "in-flight" (i.e., requested, but not yet returned) fetch addresses 120 at any given time, the fetch address queue 50 will never be oversubscribed.

Figure 6:
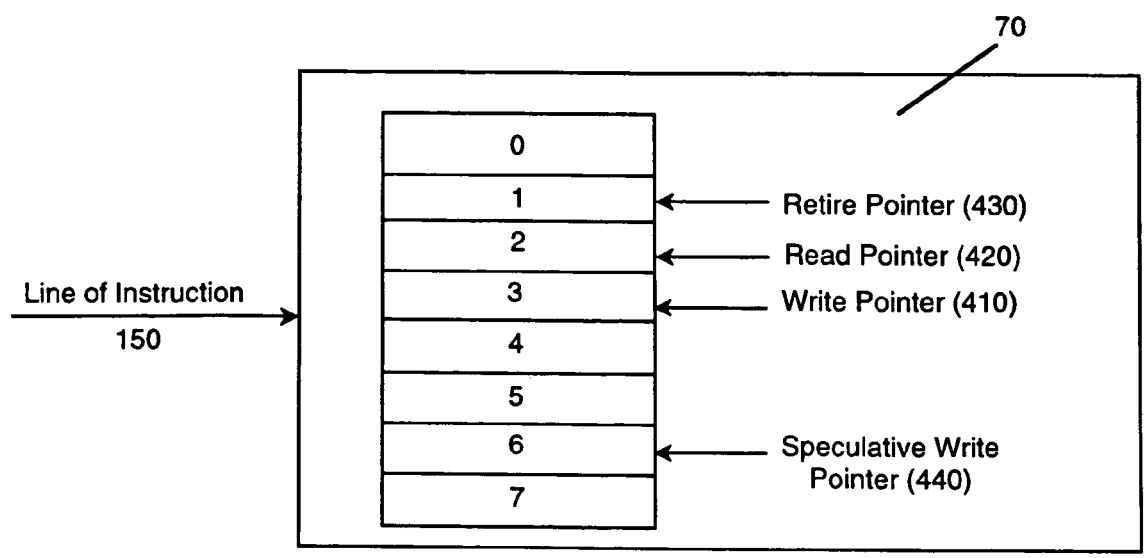
FIG. 6 is a block diagram of the MIQ.

The MIQ 70 shown in the embodiment of FIG. 3 is a decoupling queue. That is, lines of instructions 150 are written to the MIQ 70 at a different rate than they are read. For this reason, it is necessary to ensure that the MIQ 70 does not become oversubscribed. FIG. 6 shows a block diagram of an MIQ 70. To prevent the MIQ 70 from becoming oversubscribed, one embodiment uses four separate pointers 410, 420, 430, 440 to the MIQ 70 to control the flow of information to the MIQ 70. In the embodiment shown, the MIQ 70 has 8 entries, which are 16 bytes wide. A write pointer 410 identifies the entry to which a line of instructions is written and advances to the next entry on every write function. A read pointer 420 identifies the entry to be read from the MIQ 70 by the x86 engine 30. The MIQ 70 entries may hold more than one instruction in the 16 bytes of data. The x86 engine 30 might read only part of an entry at a time. Therefore, the read pointer 420 advances only when all 16 bytes are read from the entry.

The execution of instructions in the x86 engine 30 goes through several stages before the instruction is eventually retired. That is, an instruction may have been read from the MIQ 70, but remains in the x86 engine 30 for some period before it is retired. It may be desirable that the entries in the MIQ 70 not be overwritten until an instruction has been retired from the x86 engine 30. The read pointer 420 may advance before the instruction has been retired. Therefore, in one embodiment, the MIQ 70 includes a retire pointer 430 to indicate that an instruction has been retired by the x86 engine 30 and may safely be overwritten. The retire pointer 430 will lag the read pointer 420.

In one embodiment, the system prevents new fetch requests 110 from being issued by the x86 engine 30 if the MIQ 70 is full. This is done by comparing the MIQ pointers to ensure that no entry is overwritten before the desired time. The write pointer 410 must not write to entries that have not been read, as indicated by the read pointer 420. Also, it may be desirable to prevent overwriting entries that have been read but not retired, as indicated by the retire pointer 430.

As noted, however, the system may include multiple pending request stages (e.g., IIP, IPG, ROT) and the fetch address queue 50 may have multiple entries in it. For example, the embodiment shown in FIG. 3 has three entries in the fetch address queue 50, and three fetch requests 110 may be in-flight or pending at the same time. This presents a unique challenge to preventing oversubscription of the MIQ 70, because the MIQ pointers must account for the pending fetch requests 110 to ensure that the MIQ 70 has sufficient room to handle the pending requests. One embodiment of the system includes a fourth pointer, referred to as a speculative write pointer 440, to ensure that the MIQ 70 does not become oversubscribed by pending fetch requests 110. The speculative writer pointer 440 advances whenever a fetch request 110 is issued by the x86 engine 30. This way, it accounts for pending fetch requests 110 and saves space on the MIQ 70 for the returning lines of instructions 150 to be written. The speculative write pointer 440 may be compared to the retire pointer 430 to ensure that no fetch request 110 is issued before the retire pointer 430 has advanced to leave an empty entry in the MIQ 70.

For example, if the MIQ 70 has 8 entries (0-7), the write pointer 410 may be pointing at entry 3, as the entry into which the next line of instructions will be written. The read pointer 420 may point to entry 2, the entry from which the next line of instructions will be read. The retire pointer 440 may point to entry 1, the entry from which the most recent instruction was retired in the x86 engine 30. If three fetch requests 110 are already in the fetch engine 40, then the speculative write pointer will point to entry 6, leaving room on the MIQ 70 for the lines of instructions 130 that are returned for those requests 120. Because the speculative write pointer 440 cannot pass the retire pointer 430, the system can be configured such that no fetch request 110 is issued when the speculative write pointer 440 catches up to the retire pointer 430.

Although the system and method have been described in detail with reference to certain embodiments thereof, variations are possible. For example, although the values of certain data, sizes of the pipelines, number of pending fetch requests, clock cycles, and other certain specific information were given as examples, these examples were by way of illustration only, and not by way of limitation. The system and method may be embodied in other specific forms without departing from the essential spirit or attributes thereof. Although examples shown refer specifically to the IA-64 architecture and to the EM fetch engine and the x86 engine as the native and emulation systems, these are by way of illustration only and not by way of limitation. The method may be implemented on any type of architecture capable of using more than one type of ISA. It is desired that the embodiments described herein be considered in all respects as illustrative, not restrictive, and that reference be made to the appended claims for determining the scope of the invention.

The invention claimed is:

1. A method implementing a native instruction set architecture (ISA) having an emulation engine and an emulated ISA, wherein a fetch engine fetches instructions of the emulated ISA from a memory subsystem, the method comprising:
sending a fetch request signal to the fetch engine;
sending a fetch address to the fetch engine;
retrieving a line of instructions from the memory subsystem, wherein the line of instructions is associated with the fetch address;
storing the fetch address in a fetch address queue;
sending the line of instructions to the emulation engine;
sending a fetch complete signal from the fetch engine to the emulation engine when the line of instructions is sent to the emulation engine, the fetch complete signal being a signal separate from the line of instructions, wherein the step of storing comprises storing the fetch address in the fetch address queue until the fetch complete signal is sent;
storing the fetch address in a queue of the emulation engine, wherein the queue of the emulation engine mirrors the fetch address queue;
progressing the fetch address through pipeline stages of the fetch engine and the emulation engine synchronously using pipeline advance logic;
receiving, at the pipeline advance logic, a delayed version of the fetch complete signal; and
advancing the fetch address through the fetch engine and the emulation engine based on the delayed version of the fetch complete signal.

2. The method of claim 1, wherein a plurality of fetch requests may be processed at the same time.

3. The method of claim 1, further comprising sending the line of instructions to a macroinstruction queue, within the emulation engine.

4. The method of claim 3, further comprising:
determining whether the macroinstruction queue is full or will become full with one or more lines of instructions returning from one or more pending fetch requests; and
if the macroinstruction queue is full or will become full with one or more lines of instructions returning from one or more pending fetch requests, waiting until the macroinstruction queue is not full and will not become full to send a new fetch request signal.

5. The method of claim 4, further comprising using a speculative write pointer to determine whether the macroinstruction queue is full or will become full with one or more lines of instructions returning from one or more pending fetch requests by comparing a number of pending fetch requests with a number of open entries in the macroinstruction queue.

6. The method of claim 1, further comprising, if a pending fetch request is canceled due to a pipeline flush,
canceling a pending fetch request; and
clearing the fetch address queue.

7. A method for fetching a line of instructions from a memory subsystem of a mixed architecture CPU into a macroinstruction queue of an emulation engine comprising,
determining whether the macroinstruction queue is full or will become full with one or more lines of instructions returning from one or more pending fetch requests; and if the macroinstruction queue is not full and will not become full with one or more lines of instructions returning from one or more pending fetch requests, sending a fetch address to a fetch engine;

retrieving a line of instructions from a memory subsystem into the fetch engine;

sending the line of instructions to the emulation engine;

sending a fetch complete signal from the fetch engine to the emulation engine along with the line of instructions;

if the macroinstruction queue is full or will become full with one or more lines of instructions returning from one or more pending fetch requests, waiting until the macroinstruction queue is not full and will not become full before sending a fetch address to the fetch engine;

storing the fetch address in a queue of the emulation engine, wherein the queue in the emulation engine mirrors the fetch address queue;

progressing the fetch address through pipeline stages of the fetch engine and the emulation engine synchronously using pipeline advance logic;

receiving at the pipeline advance logic a delayed version of the fetch complete signal; and advancing the fetch address through the fetch engine and the emulation engine based on the delayed version of the fetch complete signal.

8. The method of claim 7, further comprising using a speculative write pointer to determine whether the macroinstruction queue is full or will become full with one or more lines of instructions returning from one or more pending fetch requests.

9. The method of claim 8, further comprising, if the macroinstruction queue is not full and will not become full, sending a fetch request signal to the fetch engine along with the fetch address.

10. The method of claim 7, further comprising, if the macroinstruction queue is not full and will not become full, buffering the fetch address in a fetch address queue in the fetch engine.

11. A multi-architecture computer system capable of implementing a native instruction set architecture (ISA) and an emulated ISA, wherein instructions of the native ISA are processed in a native ISA pipeline and instructions of the emulated ISA are processed in an emulated ISA pipeline, the system, comprising:

a memory subsystem of the native ISA;

a fetch engine of the native ISA, said fetch engine being electrically connected to the memory subsystem of the native ISA wherein the fetch engine accesses the memory subsystem to retrieve a line of instructions from the memory subsystem;

an engine of an emulated ISA, wherein the engine of the emulated ISA is electrically connected to the fetch engine and interfaces with the fetch engine using a handshake protocol, wherein the engine of the emulated ISA receives a line of instructions and a fetch complete signal from the fetch engine;

a fetch address queue that stores a fetch address for the line of instructions retrieved from the memory subsystem when the native ISA pipeline is stalled, wherein the fetch address queue is controlled by the fetch complete signal such that the fetch address is stored in the fetch address queue until the fetch complete signal is received; and pipeline advance logic, wherein the pipeline advance logic receives a delayed version of the fetch complete signal and advances the fetch address through the fetch engine and the engine of the emulated ISA based on the delayed version of the fetch complete signal.

12. The computer system of claim 11, wherein the engine of the emulated ISA requests the line of instructions and the fetch engine sends the line of instructions to the engine of the emulated ISA.

13. The computer system of claim 11, wherein, if a pending fetch request is canceled due to a pipeline flush, a pending fetch request signal is canceled; and the fetch address queue is cleared.

14. The computer system of claim 11, further comprising a macroinstruction queue that receives a line of instructions from the fetch engine.

15. The computer system of claim 14, further comprising a speculative write pointer that prevents the macroinstruction queue from becoming oversubscribed by one or more pending fetch requests, wherein the speculative write pointer may be used to control the sending of a fetch request.

* * * * *

UNITED STATES PATENT AND TRADEMARK OFFICE
CERTIFICATE OF CORRECTION

PATENT NO. : 7,356,674 B2 Page 1 of 1
APPLICATION NO. : 10/717671
DATED : April 8, 2008
INVENTOR(S) : Anuj Dua It is certified that error appears in the above-identified patent and that said Letters Patent is hereby corrected as shown below:

In column 4, line 47, delete "BP 320" and insert -- IIP 320 --, therefor.

In column 7, line 35, after "EM pipeline" insert -- 40 --.

In column 8, line 16, delete "120," and insert -- $120_1$ --, therefor.

In column 8, line 17, delete "1203" and insert -- $120_3$ --, therefor.

In column 8, line 26, delete "1204" and insert -- $120_4$ --, therefor.

In column 8, line 31, after "fetch engine" insert -- 40 --.

Signed and Sealed this

Seventh Day of October, 2008

JON W. DUDAS
*Director of the United States Patent and Trademark Office*